(12) United States Patent
Wang et al.

(10) Patent No.: US 12,300,560 B2
(45) Date of Patent: *May 13, 2025

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Han Wang, Kaohsiung (TW); Ian Hu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/440,919

(22) Filed: Feb. 13, 2024

(65) Prior Publication Data

US 2024/0186201 A1 Jun. 6, 2024

Related U.S. Application Data

(63) Continuation of application No. 17/883,550, filed on Aug. 8, 2022, now Pat. No. 11,901,252, which is a
(Continued)

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/565* (2013.01); *H01L 21/6835* (2013.01);
(Continued)

(58) Field of Classification Search
CPC ............... H01L 25/0657; H01L 25/105; H01L 2224/02372; H01L 2225/0651;
(Continued)

(56) References Cited

U.S. PATENT DOCUMENTS 8,263,439 B2 9/2012 Marimuthu et al.
8,883,561 B2 11/2014 Park et al.
(Continued)

FOREIGN PATENT DOCUMENTS

CN 102148167 B 3/2013
DE 10 2015 104 450 A1 10/2015
(Continued)

OTHER PUBLICATIONS

Final Office Action for U.S. Appl. No. 16/572,340, issued Jan. 26, 2022, 15 pages.
(Continued)

*Primary Examiner* — Victoria K. Hall
(74) *Attorney, Agent, or Firm* — FOLEY & LARDNER LLP

(57) ABSTRACT

A semiconductor device package includes a first substrate, a second substrate, and a first electronic component between the first substrate and the second substrate. The first electronic component has a first surface facing the first substrate and a second surface facing the second substrate. The semiconductor device package also includes a first electrical contact disposed on the first surface of the first electronic component and electrically connecting the first surface of the first electronic component with the first substrate. The semiconductor device package also includes a second electrical contact disposed on the second surface of the first electronic component and electrically connecting the second surface of the first electronic component with the second substrate. A method of manufacturing a semiconductor device package is also disclosed.

6 Claims, 16 Drawing Sheets

Related U.S. Application Data continuation of application No. 16/572,340, filed on Sep. 16, 2019, now Pat. No. 11,410,902.

(51) Int. Cl.
  *H01L 21/683* (2006.01)
  *H01L 23/00* (2006.01)
  *H01L 23/48* (2006.01)
  *H01L 25/065* (2023.01)
  *H01L 25/10* (2006.01)

(52) U.S. Cl.
  CPC ........ *H01L 23/3135* (2013.01); *H01L 23/481* (2013.01); *H01L 24/09* (2013.01); *H01L 24/17* (2013.01); *H01L 25/0657* (2013.01); *H01L 25/105* (2013.01); *H01L 2221/68345* (2013.01); *H01L 2221/68359* (2013.01); *H01L 2224/02372* (2013.01); *H01L 2225/0651* (2013.01); *H01L 2225/06517* (2013.01); *H01L 2225/0652* (2013.01); *H01L 2225/06527* (2013.01); *H01L 2225/06541* (2013.01); *H01L 2225/06572* (2013.01); *H01L 2225/1023* (2013.01); *H01L 2225/1041* (2013.01); *H01L 2225/1058* (2013.01); *H01L 2225/107* (2013.01)

(58) Field of Classification Search
  CPC ... H01L 2225/06517; H01L 2225/0652; H01L 2225/06527; H01L 2225/06541; H01L 2225/06572; H01L 2225/1041; H01L 2225/1058; H01L 2225/107; H01L 2225/1023; H01L 23/3128; H01L 23/3135; H01L 23/28–3192
  USPC ................................. 361/758, 783, 803, 804
  See application file for complete search history.

(56) References Cited

U.S. PATENT DOCUMENTS

| | | |
|---|---|---|
| 8,883,581 B2 | 11/2014 | Ohki |
| 8,928,132 B2 | 1/2015 | Choi et al. |
| 8,993,377 B2 | 3/2015 | Koo et al. |
| 9,048,233 B2 | 6/2015 | Wu et al. |
| 9,159,708 B2 | 10/2015 | Haba |
| 9,391,046 B2 | 7/2016 | Park et al. |
| 9,543,242 B1 | 1/2017 | Kelly et al. |
| 9,721,872 B1 | 8/2017 | Nicholls et al. |
| 9,831,148 B2 | 11/2017 | Yu et al. |
| 9,929,108 B2 | 3/2018 | Tsai et al. |
| 10,056,351 B2 | 8/2018 | Yu et al. |
| 10,153,179 B2 | 12/2018 | Lin et al. |
| 10,163,852 B2 | 12/2018 | Yu et al. |
| 10,177,078 B2 | 1/2019 | Yu et al. |
| 10,290,513 B2 | 5/2019 | Lin et al. |
| 10,497,668 B2 | 12/2019 | Yu et al. |
| 10,825,693 B2 | 11/2020 | Lin et al. |
| 11,031,344 B2 | 6/2021 | Yu et al. |
| 11,127,650 B2 | 9/2021 | Chang Chien et al. |
| 11,410,902 B2 * | 8/2022 | Wang .................... H01L 23/481 |
| 11,616,046 B2 | 3/2023 | Lin et al. |
| 11,901,252 B2 * | 2/2024 | Wang .................. H01L 21/6835 |
| 2002/0135057 A1 | 9/2002 | Kurita |
| 2008/0157328 A1 | 7/2008 | Kawata |
| 2008/0224279 A1 * | 9/2008 | Caskey .................... H01L 24/83 257/746 |
| 2011/0024916 A1 | 2/2011 | Marimuthu et al. |
| 2011/0068459 A1 | 3/2011 | Pagaila et al. |
| 2011/0149493 A1 | 6/2011 | Kwon et al. |
| 2011/0159638 A1 | 6/2011 | Wang |
| 2011/0291288 A1 | 12/2011 | Wu et al. |
| 2012/0032340 A1 | 2/2012 | Choi et al. |
| 2012/0074585 A1 | 3/2012 | Koo et al. |
| 2012/0074587 A1 | 3/2012 | Koo et al. |
| 2012/0211885 A1 * | 8/2012 | Choi .................... H01L 25/105 257/737 |
| 2012/0228780 A1 | 9/2012 | Kim et al. |
| 2012/0273960 A1 | 11/2012 | Park et al. |
| 2012/0292745 A1 | 11/2012 | Park et al. |
| 2014/0264808 A1 | 9/2014 | Wolter et al. |
| 2015/0102468 A1 | 4/2015 | Kang et al. |
| 2015/0171063 A1 | 6/2015 | Zhai et al. |
| 2015/0179591 A1 * | 6/2015 | Tsai .................... H01L 23/5384 438/666 |
| 2015/0235988 A1 | 8/2015 | Ray et al. |
| 2016/0233169 A1 | 8/2016 | Hunt |
| 2016/0260690 A1 | 9/2016 | Ganesan et al. |
| 2016/0276278 A1 | 9/2016 | Tsai et al. |
| 2016/0300806 A1 | 10/2016 | Kim et al. |
| 2017/0040294 A1 | 2/2017 | Chen et al. |
| 2017/0084550 A1 | 3/2017 | Tsai et al. |
| 2017/0098631 A1 | 4/2017 | Kikuchi et al. |
| 2017/0103946 A1 | 4/2017 | Chang et al. |
| 2017/0194266 A1 | 7/2017 | Kwon et al. |
| 2017/0194290 A1 | 7/2017 | Yu et al. |
| 2017/0221859 A1 | 8/2017 | Chen et al. |
| 2018/0025966 A1 | 1/2018 | Hwang et al. |
| 2018/0068978 A1 | 3/2018 | Jeng et al. |
| 2018/0076179 A1 | 3/2018 | Hsu et al. |
| 2018/0151477 A1 * | 5/2018 | Yu .......................... H01L 24/20 |
| 2018/0218985 A1 | 8/2018 | Tsai et al. |
| 2018/0226349 A1 * | 8/2018 | Yu .......................... H01L 21/568 |
| 2018/0233452 A1 | 8/2018 | Lin et al. |
| 2018/0269188 A1 | 9/2018 | Yu et al. |
| 2018/0323150 A1 | 11/2018 | Yu et al. |
| 2019/0006316 A1 | 1/2019 | Yu et al. |
| 2019/0027446 A1 | 1/2019 | Cheng et al. |
| 2019/0237430 A1 | 8/2019 | England |
| 2020/0006133 A1 | 1/2020 | Cheng et al. |
| 2020/0006242 A1 | 1/2020 | Jee et al. |
| 2020/0058622 A1 | 2/2020 | Chen et al. |
| 2020/0303348 A1 | 9/2020 | Campos |
| 2020/0328161 A1 | 10/2020 | Lin et al. |
| 2020/0335441 A1 | 10/2020 | Kim et al. |
| 2020/0343184 A1 | 10/2020 | Fujishima et al. |
| 2020/0357770 A1 | 11/2020 | Chiang et al. |
| 2020/0381325 A1 | 12/2020 | Huang et al. |
| 2020/0381391 A1 | 12/2020 | Yu et al. |
| 2020/0411461 A1 | 12/2020 | Lee et al. |
| 2021/0057363 A1 | 2/2021 | Chen et al. |
| 2021/0082782 A1 | 3/2021 | Wang |

FOREIGN PATENT DOCUMENTS

| | | |
|---|---|---|
| DE | 10 2018 106 672 A1 | 1/2019 |
| WO | WO-2020/132909 A1 | 7/2020 |

OTHER PUBLICATIONS

Machine translation, Fu, WIPO Pat. Pub. No. WO-2020/132909-A1, translation date: Jun. 16, 2023, Clarivate Analytics, all pages. (Year: 2023).

Machine translation, Yu, Chinese Pat. Pub. No. CN-102148167-B, translation date: Jun. 16, 2023, Clarivate Analytics, all pages. (Year: 2023).

Non-Final Office Action for U.S. Appl. No. 16/572,340, issued Aug. 31, 2021, 23 pages.

Non-Final Office Action for U.S. Appl. No. 17/883,550, issued Jun. 23, 2023, 19 pages.

Notice of Allowance for U.S. Appl. No. 16/572,340, issued Mar. 30, 2022, 13 pages.

Notice of Allowance for U.S. Appl. No. 17/883,550, issued Oct. 4, 2023, 11 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 17/883,550, filed Aug. 8, 2022, now U.S. Pat. No. 11,901,252, which is a continuation of U.S. patent application Ser. No. 16/572,340 filed Sep. 16, 2019, now U.S. Pat. No. 11,410,902, the contents of which are incorporated herein by reference in their entirety.

BACKGROUND

1. Technical Field

The present disclosure generally relates to a semiconductor device package and a method of manufacturing the same, and to a semiconductor device package including an electronic component and a method of manufacturing the same.

2. Description of the Related Art

Package on Package (POP) technique can be used to combine discrete packages, and usually composed of two packages, such as a memory device mounted on top of a logic device, connected through an interposer.

SUMMARY

In one or more embodiments, a semiconductor device package includes a first substrate, a second substrate, and a first electronic component between the first substrate and the second substrate. The first electronic component has a first surface facing the first substrate and a second surface facing the second substrate. The semiconductor device package also includes a first electrical contact disposed on the first surface of the first electronic component and electrically connecting the first surface of the first electronic component with the first substrate. The semiconductor device package also includes a second electrical contact disposed on the second surface of the first electronic component and electrically connecting the second surface of the first electronic component with the second substrate.

In one or more embodiments, a semiconductor device package includes a first substrate and a first electronic component disposed on the first substrate. The first electronic component has an active surface facing the first substrate and a backside surface opposite to the active surface. The semiconductor device package also includes a first redistribution layer (RDL) disposed on the backside surface of the first electronic component. The semiconductor device package also includes a conductive via penetrating the first electronic component and electrically connecting the active surface of the first electronic component with the RDL.

In one or more embodiments, a method of manufacturing a semiconductor device package includes providing an electronic component. The electronic component has a first surface and a second surface opposite to the first surface. The method also includes disposing a first electrical contact on the first surface of the electronic component. The method also includes disposing the electronic component on a first substrate. The first electrical contact is between the electronic component and the first substrate. The method also includes providing an electronic structure on the second surface of the electronic component. The electronic structure includes a second electrical contact electrically connected with the first electrical contact.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
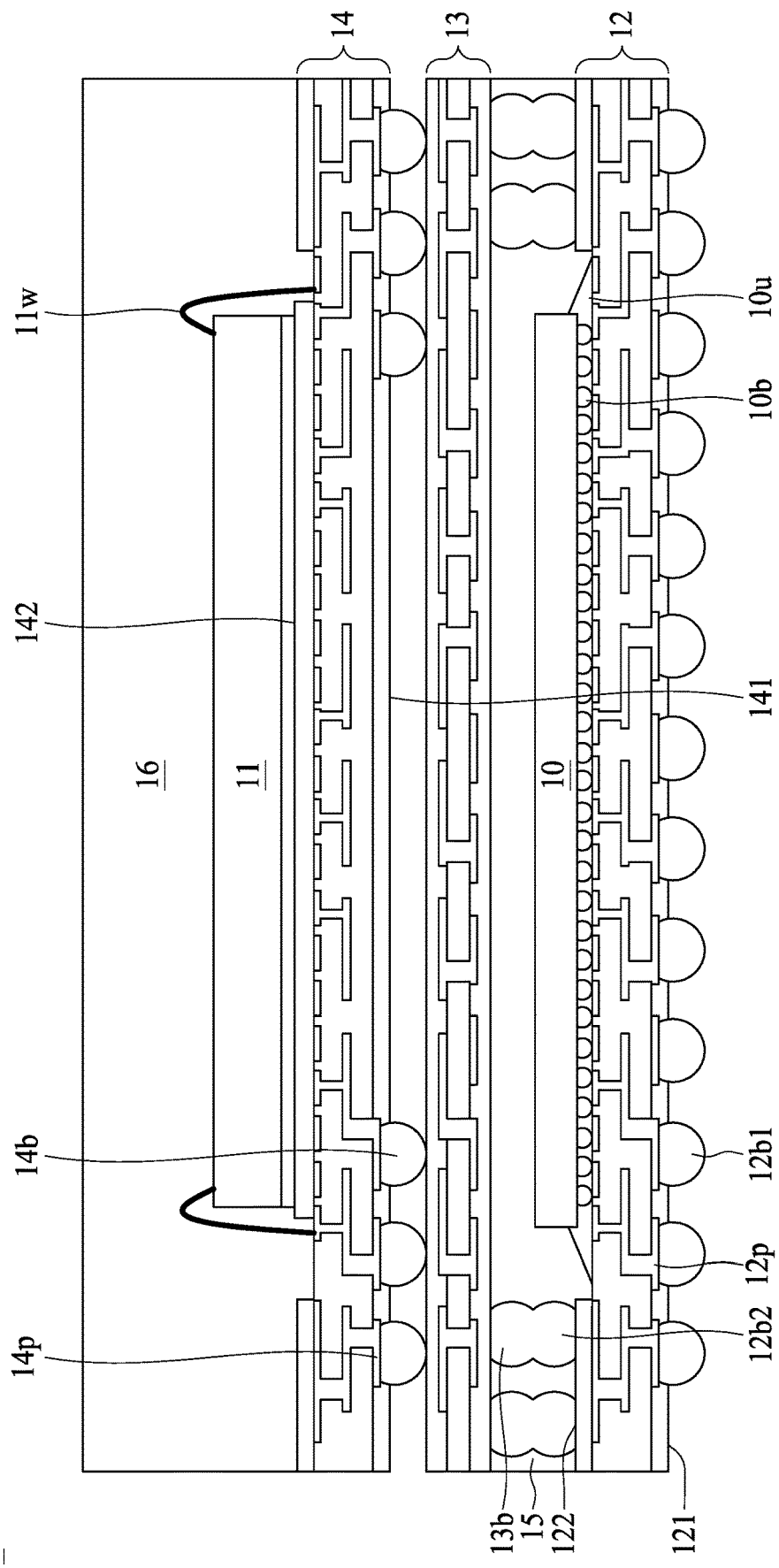
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes electronic components 10 and 11, substrates 12 and 14, an interposer 13, and encapsulating layers 15 and 16.

Each of the substrates 12 and 14 may be, for example, a printed circuit board, such as a paper-based copper foil laminate, a composite copper foil laminate, or a polymer-impregnated glass-fiber-based copper foil laminate. Each of the substrates 12 and 14 may be, or may include, an interconnection structure, such as a redistribution layer (RDL) or a grounding element.

The substrate 12 has a surface 121 and a surface 122 opposite to the surface 121. The substrate 12 may include one or more conductive pads 12p in proximity to, adjacent to, or embedded in and exposed at the surface 121 of the substrate 12. The substrate 12 may include a solder resist (not shown) on the surface 12 of the substrate 12 to fully expose or to expose at least a portion of the conductive pads 12p for electrical connections. Electrical contact 12b1 (e.g. a solder ball) is disposed on the conductive pads 12p and can provide electrical connections between the semiconductor package device 1 and external components (e.g. external circuits or circuit boards). In some embodiments, the electrical contact 12b1 includes a controlled collapse chip connection (C4) bump, a ball grid array (BGA) or a land grid array (LGA). Opposite to the surface 121 of the substrate 12, an electrical contact 12b2 is provided on the surface 122 of the substrate 12 through a solder paste to provide electrical connections to external components.

The electronic component 10 is disposed on the surface 122 of the substrate 12. The electronic component 10 may be a chip, a die including a semiconductor substrate, a central processing unit (CPU), a graphics processing unit (GPU), an accelerated processing unit (APU), or the likes. The electronic component 10 may include one or more integrated circuit devices (such as active devices and/or passive devices) and one or more overlying interconnection structures therein. The electronic component 10 may have high input/output (I/O) connections to meet high bandwidth specifications. As shown in FIG. 1, the electronic component 10 has an electrical contact 10b electrically connected to the substrate 12 and an underfill 10u surrounding the electrical contact 10b. In some embodiments, the electrical contact 10b may include a micro bump, a C4 bump, a BGA or a LGA. In some embodiments, the underfill 10u may include an epoxy resin, a molding compound (e.g., an epoxy molding compound or other molding compound), a polyimide (PI), a phenolic compound or material, a material including a silicone dispersed therein, or a combination thereof.

The encapsulating layer 15 is disposed on the surface 122 of the substrate 12 to cover and encapsulate the electronic component 10. In some embodiments, the encapsulating layer 15 may include, for example, one or more organic materials (e.g., a molding compound, bismaleimide triazine (BT), a PI, a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

Similar to the substrate 12, the substrate 14 has a surface 141 facing the surface 122 and a surface 142 opposite to the surface 141. The substrate 14 may include one or more conductive pads 14p. Electrical contact 14b is disposed on the conductive pads 14p to provide electrical connections to external components.

The electronic component 11 is disposed on the surface 142 of the substrate 14 and electrically connected with the substrate 14 through a flip-chip technique, a wire bonding technique (e.g., through a wire 11w), or other suitable technique. The electronic component 11 may be a chip, a die including a semiconductor substrate, a semiconductor memory (e.g., a dynamic random-access memory (DRAM)), or the likes.

The encapsulating layer 16 is disposed on the surface 142 of the substrate 14 to cover and encapsulate the electronic component 11. In some embodiments, the encapsulating layer 16 may include a material as noted above for the encapsulating layer 15.

The electronic component 10, encapsulated in the encapsulating layer 15 and disposed on the substrate 12, is electronically connected to the electronic component 11, encapsulated in the encapsulating layer 16 and disposed on the substrate 14, through the interposer 13 and an electrical contact 13b provided thereon. The interposer 13 is disposed between the electronic component 10 and the substrate 14. The interposer 13 may include, for example, a printed circuit board, such as a paper-based copper foil laminate, a composite copper foil laminate, or a polymer-impregnated glass-fiber-based copper foil laminate. The interposer 13 may be, or may include, an interconnection structure, such as a RDL or a grounding element.

A sum of a thickness of the interposer 13 and a gap between the surface 141 and the interposer 13 is equal to or greater than 200 micrometer (μm), 230 μm, 250 μm, or more. A sum of the thickness of the semiconductor device package 1 is equal to or greater than 1.0 μm, 1.03 μm, 1.06 μm, or more.

With the interposer 13 in the semiconductor device package 1, the memory device (such as the electronic component 11) can be electrically connected to the logic device (such as the electronic component 10) by vertically stacking to each other through package-on-package (POP) technique. However, as technology advances, a semiconductor device package having a further reduced thickness is desired. In addition, as shown in the FIG. 1, the current from the electric component 10 to the electric component 11 flows through the electrical contact 10b, the substrate 12, the electrical contact 12b2, the electrical contact 13b, the substrate 13, the electrical contact 14b, the substrate 14, and the wire 11w. As technology advances, chips are provided with relatively more I/O connections in, for examples, High Bandwidth Package on Package (HBPoP). The length of the circuit loop in the semiconductor device package 1 of FIG. 1 is long and may adversely affect the performance thereof.

Figure 2:
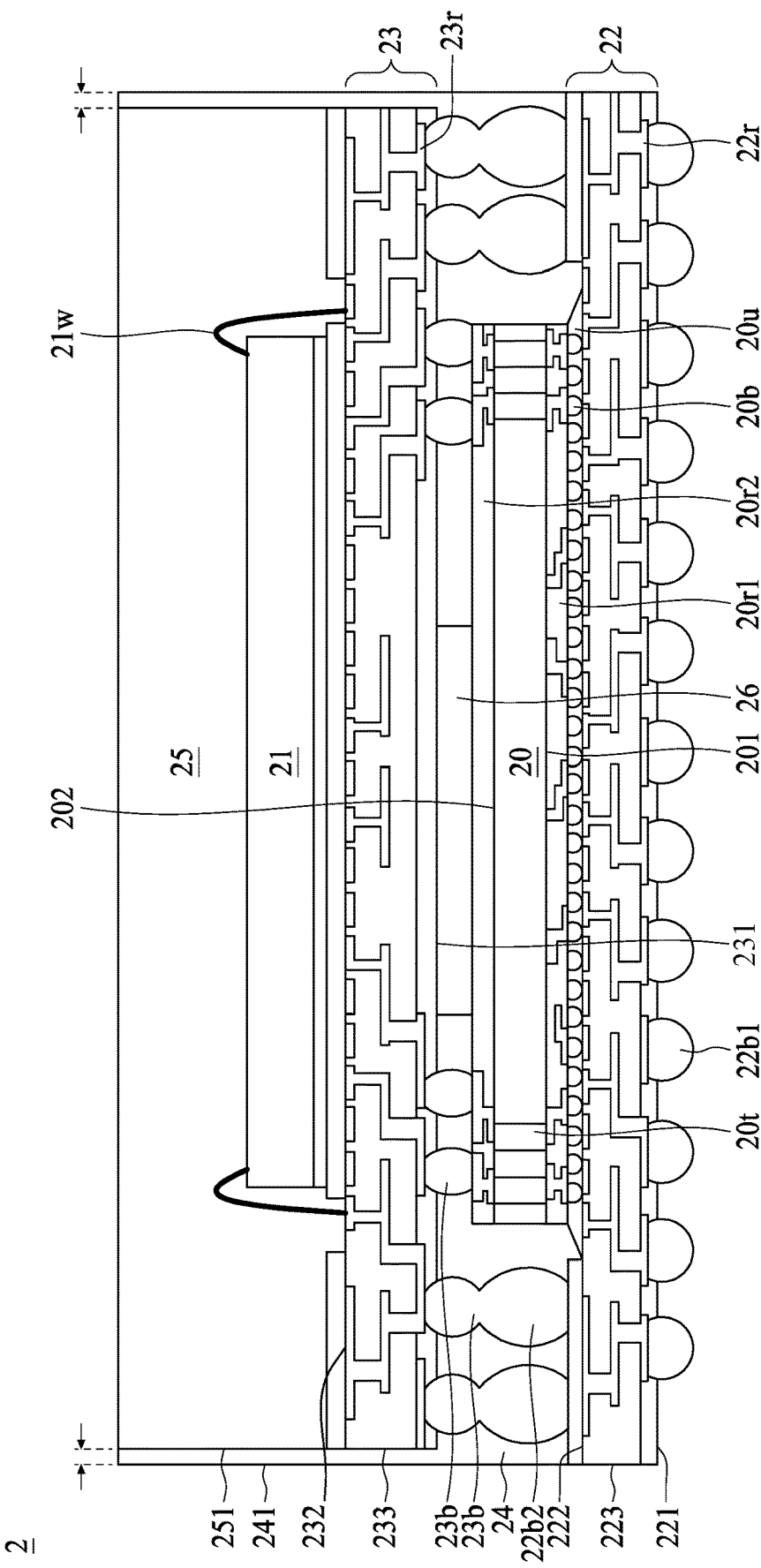
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 includes electronic components 20 and 21, substrates 22, and 23, and encapsulating layers 24 and 25.

The substrate 22 may have a material and/or a configuration as noted above for the substrates 12 and 14 in FIG. 1, and may have a conductive layer 22r. As shown in FIG. 2, the substrate 22 has a surface 221, a surface 222 opposite to the surface 221, and a surface 223 (such as a lateral surface) connected between the surfaces 221 and 222. Electrical contacts 22b1 and 22b2 are disposed on the surfaces 221 and 222 of the substrate 22 to provide electrical connections to external components.

The electronic component 20 may have a material and/or a configuration as noted above for the electronic component 10 in FIG. 1. The electronic component 20 is disposed on the surface 222 of the substrate 22. The electronic component 20 has a surface 201 (such as an active surface) facing the substrate 22 and a surface 202 (such as a backside surface) opposite to the surface 201. The electronic component 20 includes an interconnection structure 20r1 (such as a RDL) on the surface 201. The electronic component 20 includes an interconnection structure 20r2 on the surface 202. The electronic component 20 includes a conductive via 20t (such as a through silicon via (TSV)) therewithin and electrically connected the interconnection structure 20r1 to the interconnection structure 20r2. An electrical contact 20b (surrounded by an underfill 20u) is provided on the interconnection structure 20r1.

The interconnection structure 20r1 and the electrical contact 20b provide the electrical connection between the electronic component 20 and the substrate 22. In some embodiments, the electronic component 20 is devoid of the interconnection structure 20r1 on the surface 201, and the electrical contact 20b is provided on the surface 201 of the electronic component 20.

The interconnection structure 20r2 and the electrical contact 23b (disposed on a surface 231 of the substrate 23) provide the electrical connection between the electronic component 20 and the substrate 23.

A buffer layer 26 is disposed between the interconnection structure 20r2 and the substrate 23. The buffer layer 26 may include an adhesive, a glue, or other suitable material, such as a material for die-attaching.

Still referring to FIG. 2, the substrate 23 may have a material and/or a configuration as noted above for the substrates 12 and 14 in FIG. 1, and may have a conductive layer 23r. As shown in FIG. 2, the substrate 23 has a surface 231 facing the surface 202, a surface 232 opposite to the surface 231, and a surface 233 (such as a lateral surface) connected between the surfaces 231 and 232. The electrical contact 23b is disposed on the surfaces 231 of the substrate 23 to provide the electrical connection to the electronic component 20 and the substrate 22.

The electronic component 21 may have a material and/or a configuration as noted above the electronic component 11 in FIG. 1. The electronic component 21 is disposed on the surface 232 of the substrate 23 and electrically connected with the substrate 23 through a flip-chip technique, a wire bonding technique (e.g., through a wire 21w), other suitable techniques.

The encapsulating layer 25 may have a material and/or a configuration as noted above for the encapsulating layer 16 in FIG. 1. The encapsulating layer 25 is disposed on the surface 232 of the substrate 23 to cover and encapsulate the electronic component 21. As shown in FIG. 2, the encapsulating layer 25 has a surface 251 substantially coplanar with the surface 233 of the substrate 23. The surface 251 of the encapsulating layer 25 and the surface 233 of the substrate 23 are in contact with the encapsulating layer 24.

The encapsulating layer 24 may have the same material as encapsulating layer 25. In some embodiments, the encapsulating layer 24 and the encapsulating layer 25 may have different materials.

The encapsulating layer 24 is disposed on the surface 222 of the substrate 22 to cover and encapsulate the electronic component 20. The encapsulating layer 24 surrounds the electronic component 20, the substrate 23, and the encapsulating layer 25. The encapsulating layer 24 includes a surface 241 substantially coplanar with the surface 223 of the substrate 22. The surface 241 of the encapsulating layer 24 and the surface 223 of the substrate 22 are spaced apart from the surface 251 of the encapsulating layer 25 and the surface 233 of the substrate 23. The surface 241 of the encapsulating layer 24 and the surface 223 of the substrate 22 surround the surface 251 of the encapsulating layer 25 and the surface 233 of the substrate 23. The surface 251 of the encapsulating layer 25 and the surface 233 of the substrate 23 is recessed from the surface 241 of the encapsulating layer 24 and the surface 223 of the substrate 22. The surface 251 of the encapsulating layer 25 and the surface 233 of the substrate 23 is surrounded by the surface 241 of the encapsulating layer 24 and the surface 223 of the substrate 22.

The electrical contact 23b provided on the surface 231 of the substrate 23 may be stacked on the electrical contact 22b2 over the surface 222 of the substrate 22. The electrical contact 23b stacked on the electrical contact 22b2 is disposed next to the electronic component 20. In some embodiments, the electrical contact 23b stacked on the electrical contact 22b2 may be replaced with a solder ball or a cupper (Cu) pillar.

The current from the electric component 20 may flow to the electric component 21 through the interconnection structure 20r1, the conductive via 20t, the interconnection structure 20r2, the electrical contact 23b, the conductive layer 23r in the substrate 23, and the wire 21w. The circuit loop in the semiconductor device package 2 of FIG. 2 is shorter than the circuit loop in the semiconductor device package 1 of FIG. 1, which helps to achieve a better performance thereof. The current from the electric component 20 may also flow to the electric component 21 through the electrical contact 20b, the substrate 22, and the electrical contacts 22b2 and 23b (which is a circuit loop similar to that in the semiconductor device package 1 of FIG. 1). By this way, the current from the electric component 20 can be distributed, for example, the current directly passing through the conductive via 20t may be used for high-bandwidth transmission, and the current passing through the electrical contacts 22b2 and 23b may be grounded.

In addition, since the current may flow from the interconnection structure 20r1 to the substrate 23 through the interconnection structure 20r2 and the electrical contact 23b, an interposer may be omitted in the semiconductor device package 2, which helps to reduce the thickness of the semiconductor device package 2.

Figure 3:
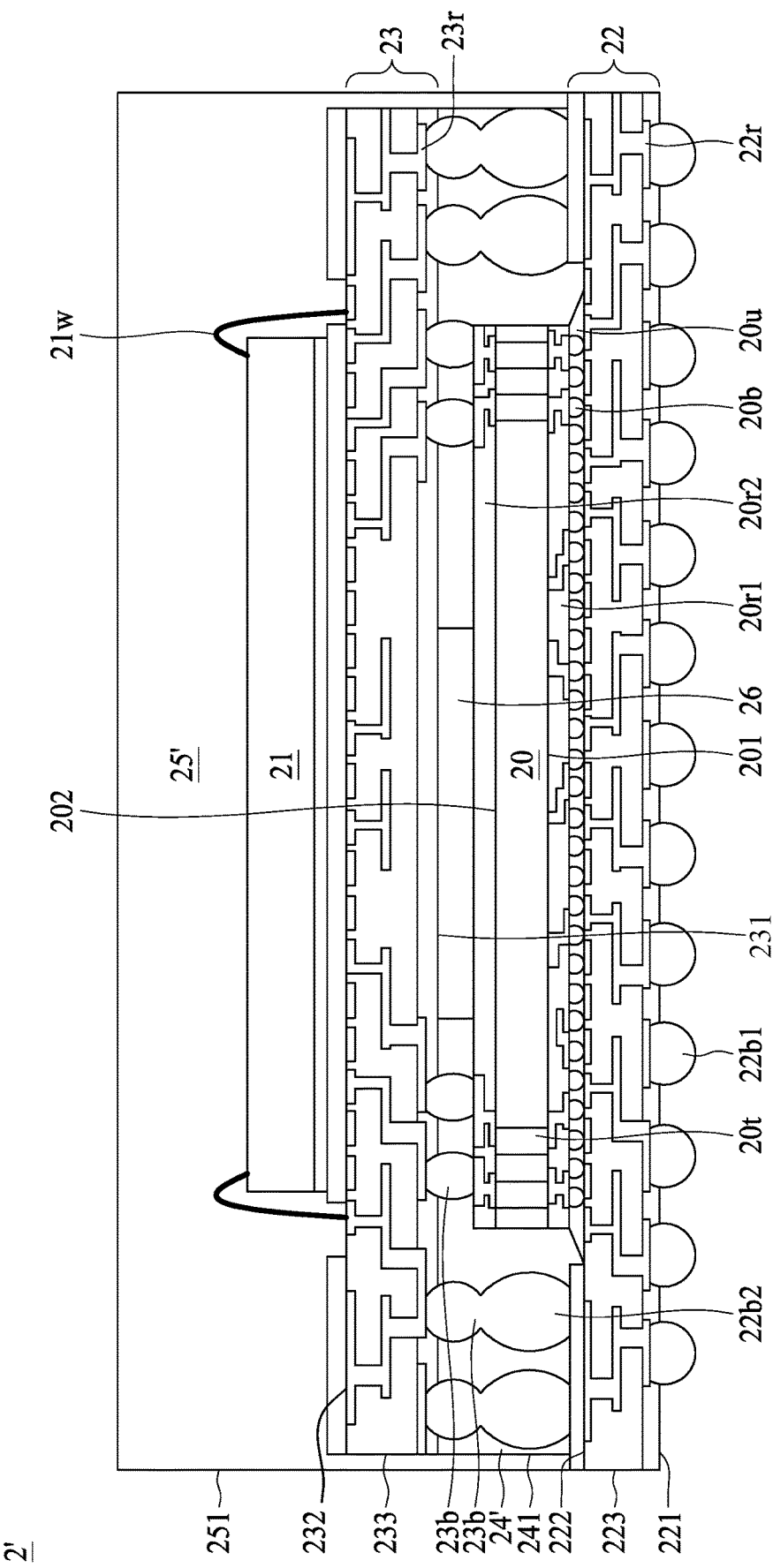
FIG. 3 illustrates a cross-sectional view of a semiconductor device package in accordance with some embodiments of the present disclosure.

FIG. 3 illustrates a cross-sectional view of a semiconductor device package 2' in accordance with some embodiments of the present disclosure. The semiconductor device package 2' of FIG. 3 is similar to the semiconductor device package 2 of FIG. 2, and the differences therebetween is described below.

The encapsulating layer 25' may have a material and/or a configuration as noted above for the encapsulating layer 25 in FIG. 2. The encapsulating layer 25' is disposed on the surface 232 of the substrate 23. The encapsulating layer 25' is disposed on a portion of the surface 222 of the substrate 22.

The encapsulating layer 24' may have a material and/or a configuration as noted above for the encapsulating layer 24 in FIG. 2. The encapsulating layer 24' has a surface 241 substantially coplanar with the surface 233 of the substrate 23. The surface 241 is in contact with the encapsulating layer 25'. The surface 241 is surrounded by the encapsulating layer 25'. The encapsulating layer 25' has a surface 251 surrounding the surface 241 of the encapsulating layer 24' and the surface 233 of the substrate 23.

FIG. 4A, FIG. 4B, FIG. 4C, FIG. 4D, FIG. 4E, FIG. 4F, FIG. 4G, FIG. 4H, and FIG. 4I are cross-sectional views of a semiconductor device package at various stages of fabrication, in accordance with some embodiments of the present disclosure. At least some of these figures have been simplified for a better understanding of the aspects of the present disclosure.

Figure 4A:
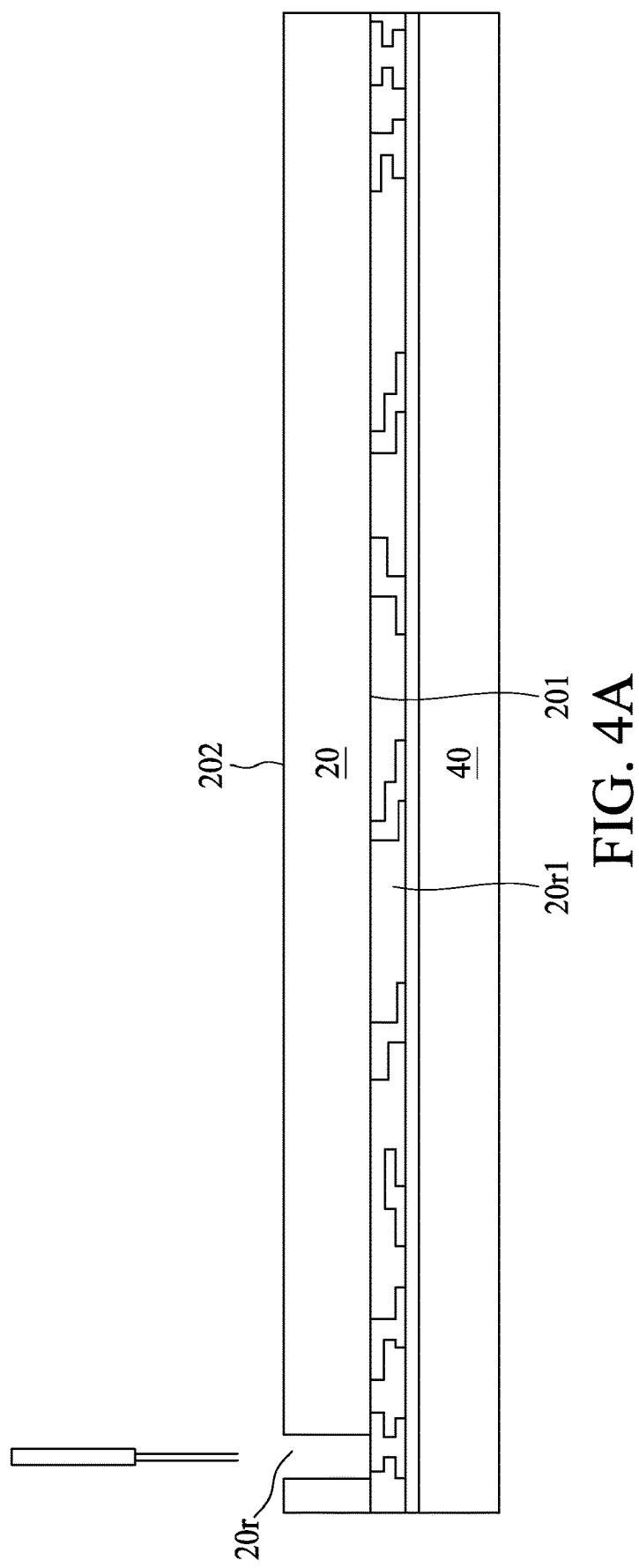
FIG. 4A illustrates one or more stages of a method of manufacturing a semiconductor device package in accordance with some embodiments of the present disclosure.

Referring to FIG. 4A, an electronic component 20 is provided on a carrier 40, and an opening 20r is formed in the electronic component 20 through a laser drill. The electronic component 20 has a surface 201 (such as an active surface) and a surface 202 (such as a backside surface) opposite to the surface 201. The electronic component 20 includes an interconnection structure 20r1 on the surface 201. A part of the interconnection structure 20r1 is exposed through the opening 20r.

Figure 4B:
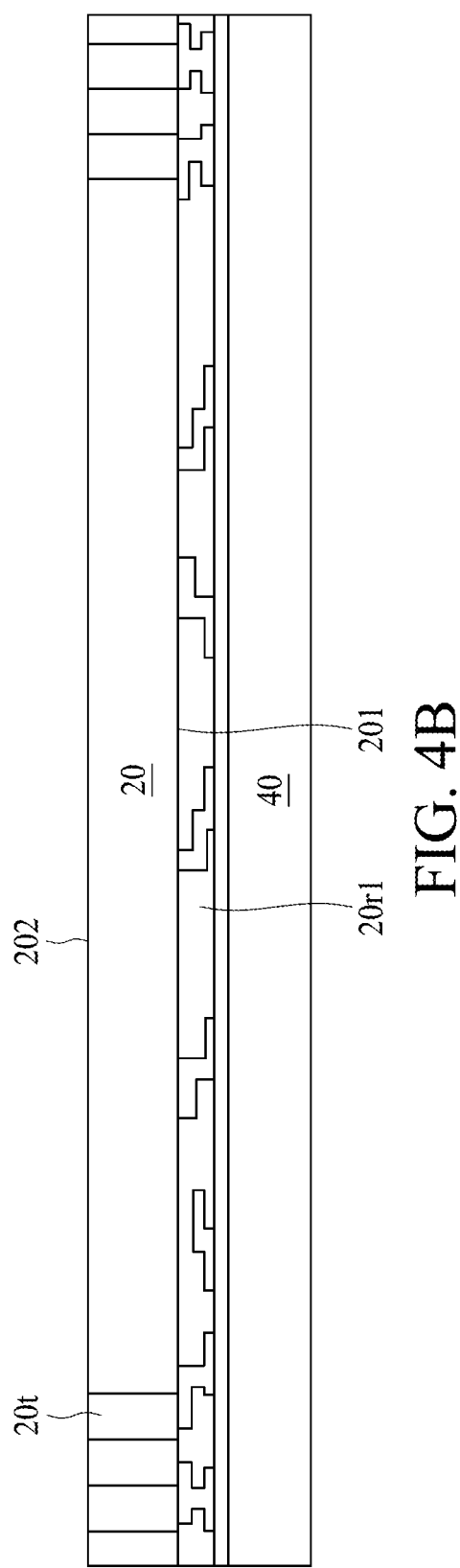
FIG. 4B illustrates one or more stages of a method of manufacturing a semiconductor device package in accordance with some embodiments of the present disclosure.

Referring to FIG. 4B, a conductive via 20t is formed in the electronic component 20. In some embodiments, the conductive via 20t may be formed by disposing a conductive material in the opening 20r through sputtering, electroless plating, plating, or other suitable processes. The conductive material may include, for example, gold (Au), silver (Ag), copper (Cu), nickel (Ni), palladium (Pd), another metal, a solder alloy, or a combination of two or more thereof.

Figure 4C:
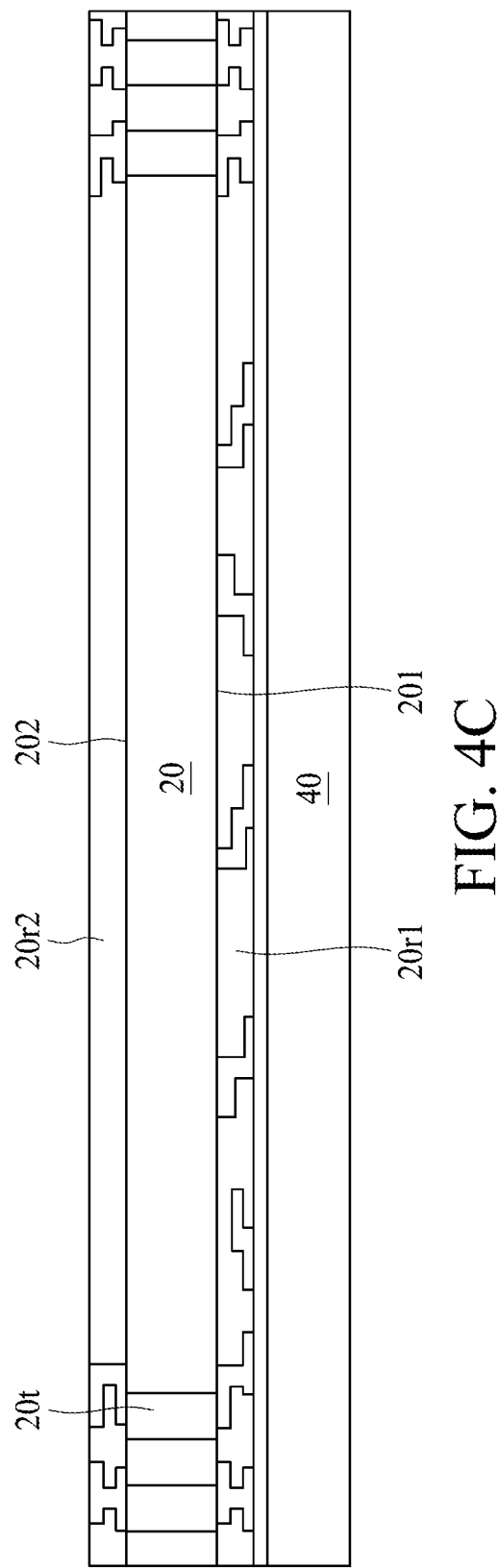
FIG. 4C illustrates one or more stages of a method of manufacturing a semiconductor device package in accordance with some embodiments of the present disclosure.

Referring to FIG. 4C, an interconnection structure 20r2 is formed on the surface 202 of the substrate 20. In some embodiments, the process may be conducted by forming a dielectric layer by, for example, coating, lamination or other suitable processes, patterning the dielectric layer through a photoresist film (or a mask) to form a cavity, and disposing a conductive material in the cavity.

Figure 4D:
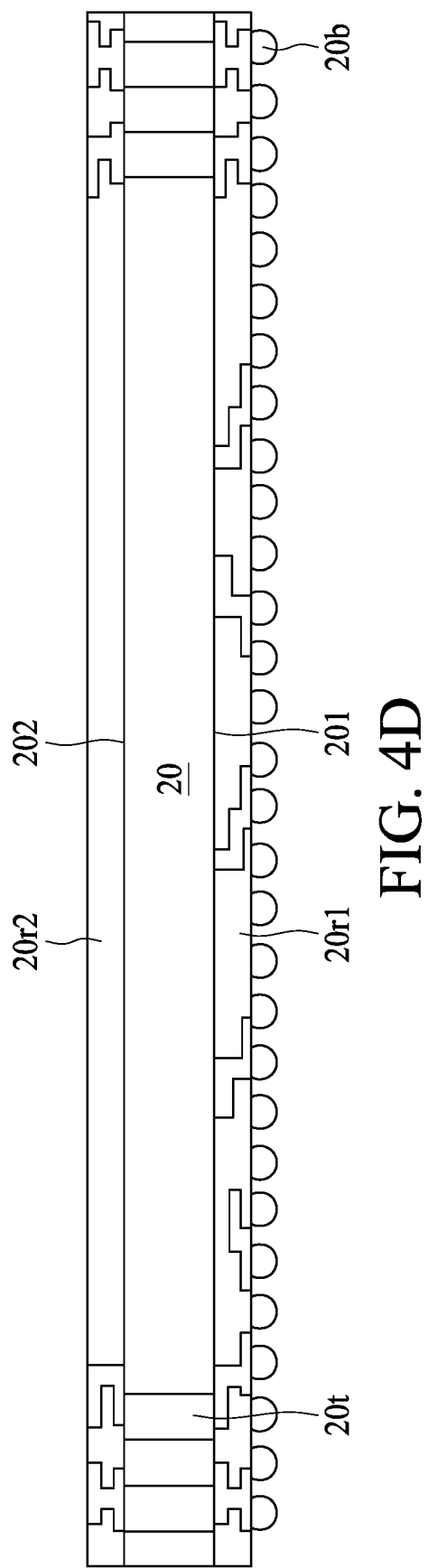
FIG. 4D illustrates one or more stages of a method of manufacturing a semiconductor device package in accordance with some embodiments of the present disclosure.
Figure 4E:
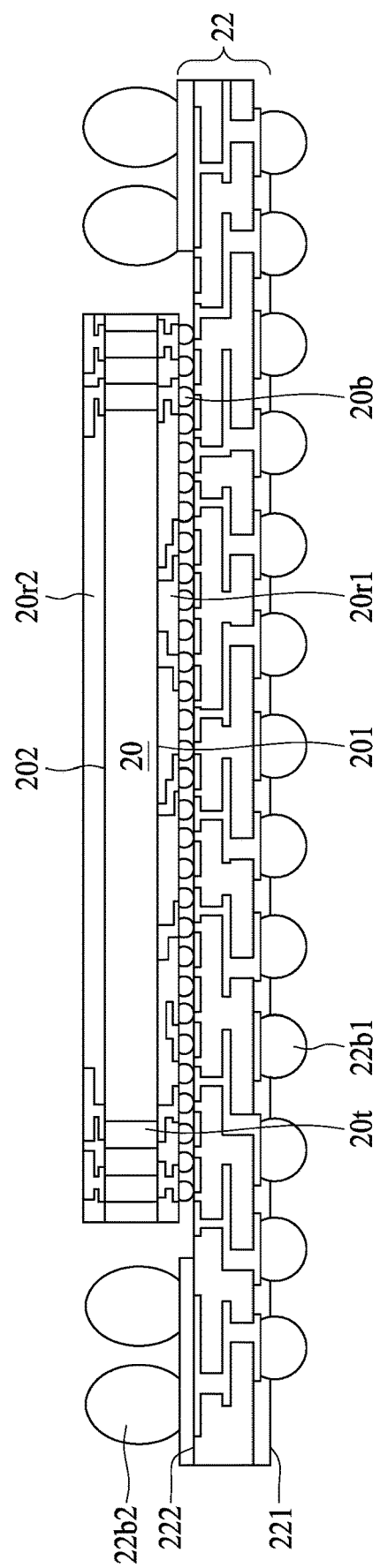
FIG. 4E illustrates one or more stages of a method of manufacturing a semiconductor device package in accordance with some embodiments of the present disclosure.

Referring to FIG. 4D, the carrier 40 is removed to expose the interconnection structure 20r1 on the surface 201 of the substrate 20. An electrical contact 20b is provided on the interconnection structure 20r1. Then, in some embodiments, a singulation may be performed to separate out individual devices. That is, the singulation may be performed through the substrate 20 including the interconnection structures 20r1 and 20r2. The singulation may be performed, for example, by using a dicing saw, laser or other appropriate cutting technique Referring to FIG. 4E, disposing the structure obtained from the operations in FIG. 4A to FIG. 4D on a surface 222 of a substrate 22. The electronic component 20 and the substrate 22 are electrically connected through the electrical contact 20b and the interconnection structure 20r1. Electrical contact 22b1 is provided on a surface 221 of the substrate 22 facing away from the electronic component 20. Electrical contact 22b2 is provided on the surface 222 of the substrate 22 and next to the electronic component 20. In some embodiments, the top surface of the electrical contact 22b2 is higher than or equal to the top surface of the interconnection structure 20r2.

Figure 4F:
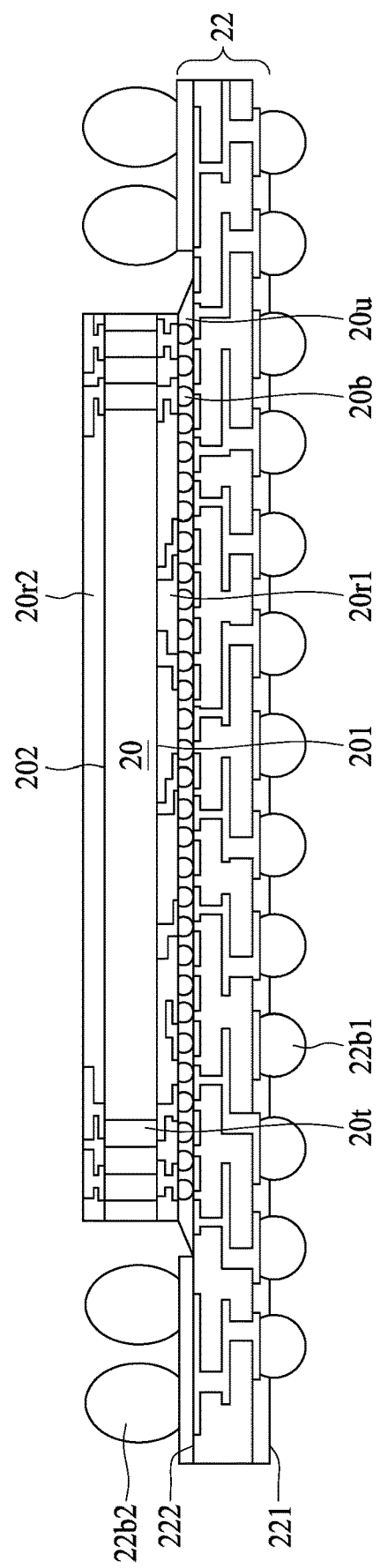
FIG. 4F illustrates one or more stages of a method of manufacturing a semiconductor device package in accordance with some embodiments of the present disclosure.

Referring to FIG. 4F, an underfill 20u is disposed between the electronic component 20 and the substrate 22 to surround the electrical contact 20b.

Figure 4G:
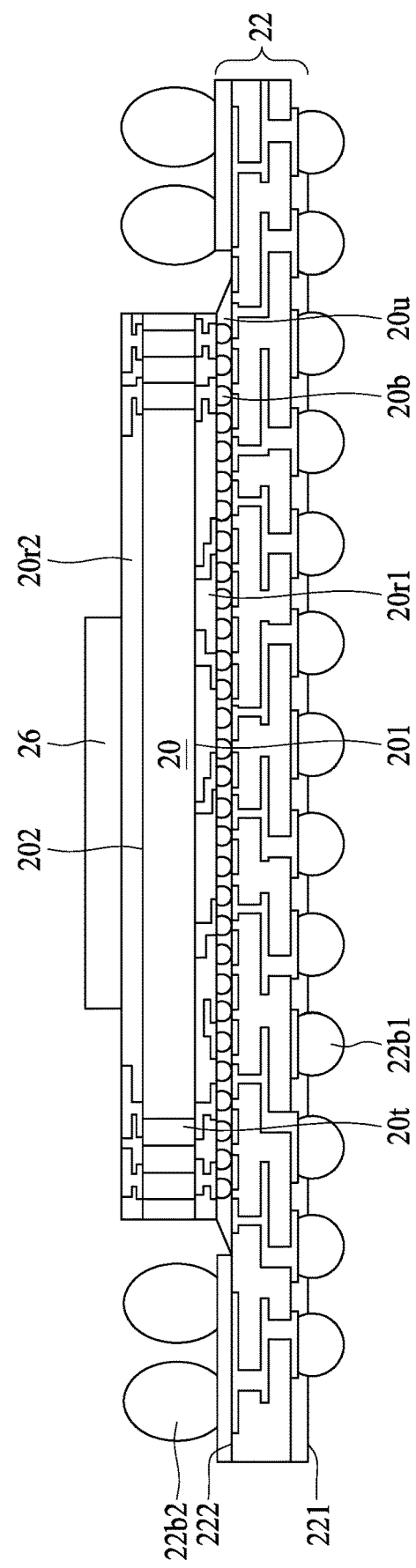
FIG. 4G illustrates one or more stages of a method of manufacturing a semiconductor device package in accordance with some embodiments of the present disclosure.

Referring to FIG. 4G, a buffer layer 26 is disposed on the interconnection structure 20r2.

Figure 4H:
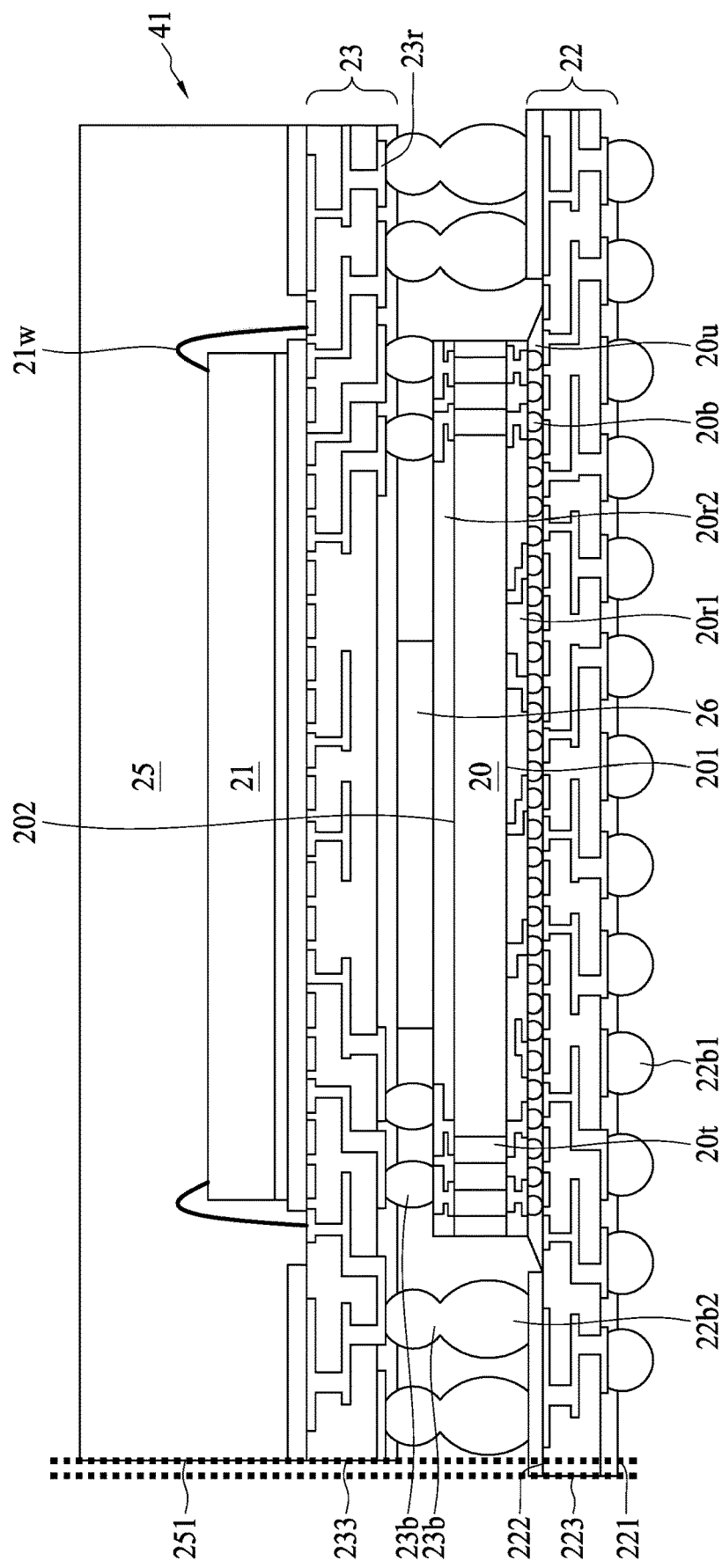
FIG. 4H illustrates one or more stages of a method of manufacturing a semiconductor device package in accordance with some embodiments of the present disclosure.

Referring to FIG. 4H, a substrate 23, an electronic component 21, an encapsulating layer 25, and an electrical contact 23b is combined and integrated as a unit 41 (such as an electronic structure). The unit 41 is provided on the substrate 22 and the electronic component 20. The electrical contact 23b is disposed on the electrical contact 22b2. The electrical contact 23b is disposed on the interconnection structure 20r2. The unit 41 has a surface (composed of a surface 251 of the encapsulating layer 25 and a surface 233 of the substrate 23) spaced apart from (or recessed from) a surface 223 of the substrate 22.

Figure 4I:
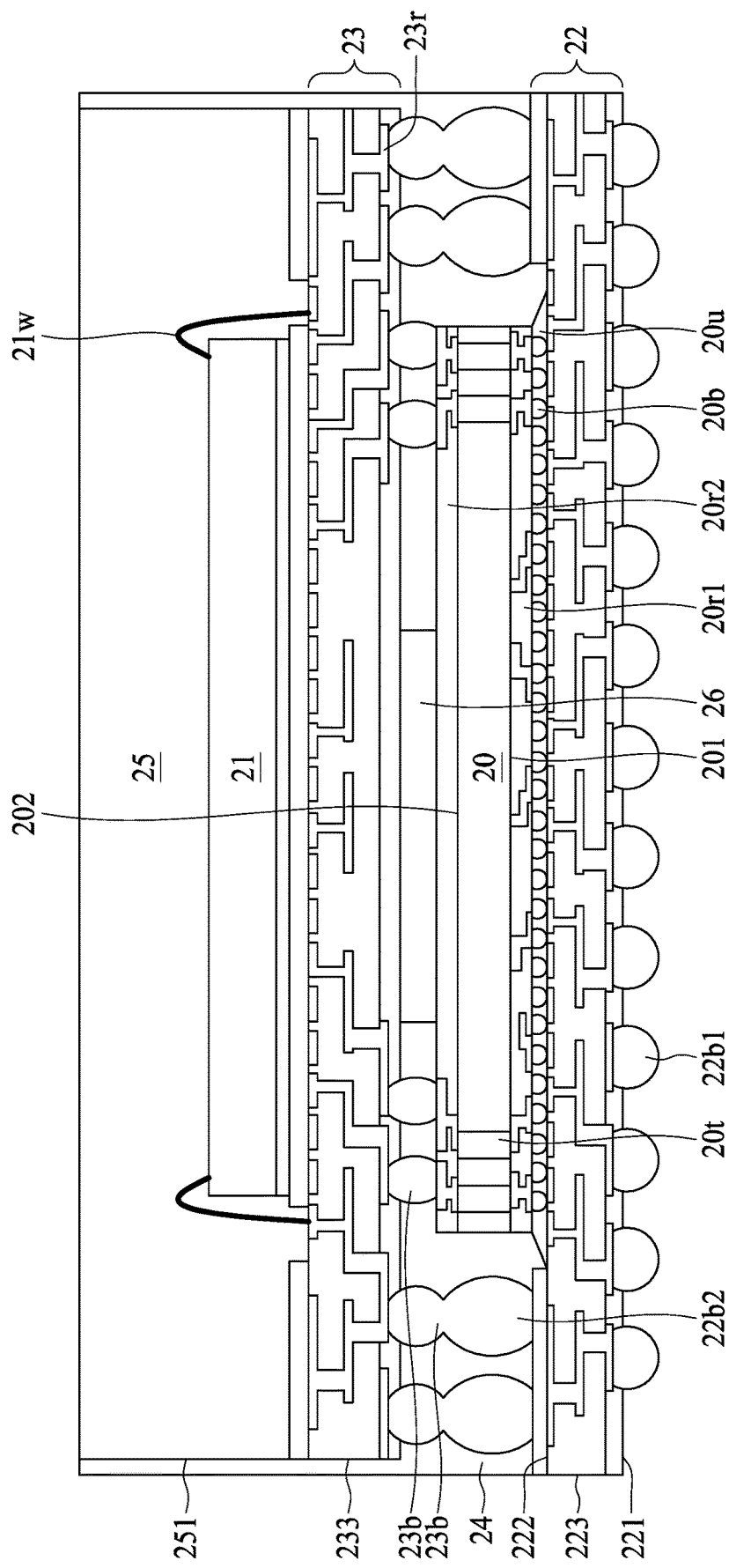
FIG. 4I illustrates one or more stages of a method of manufacturing a semiconductor device package in accordance with some embodiments of the present disclosure.

Referring to FIG. 4I, an encapsulating layer 24 is provided on the substrate 22 to cover and encapsulate the electronic component 20. The encapsulating layer 24 is also provided to surround the surface 251 and the surface 233. In some embodiments, although not shown in the figures, the encapsulating layer 24 may be provided on the top surface of the encapsulating layer 25. The encapsulating layer 24 may be formed by a molding technique. A singulation may be performed to separate out individual semiconductor package devices. That is, the singulation may be performed through the encapsulating layer 24 and a substrate strip including the substrate 22. The singulation may be performed, for example, by using a dicing saw, laser or other appropriate cutting technique.

FIG. 5A, FIG. 5B, FIG. 5C, and FIG. 5D are cross-sectional views of a semiconductor device package at various stages of fabrication, in accordance with some embodiments of the present disclosure. At least some of these figures have been simplified for a better understanding of the aspects of the present disclosure.

Figure 5A:
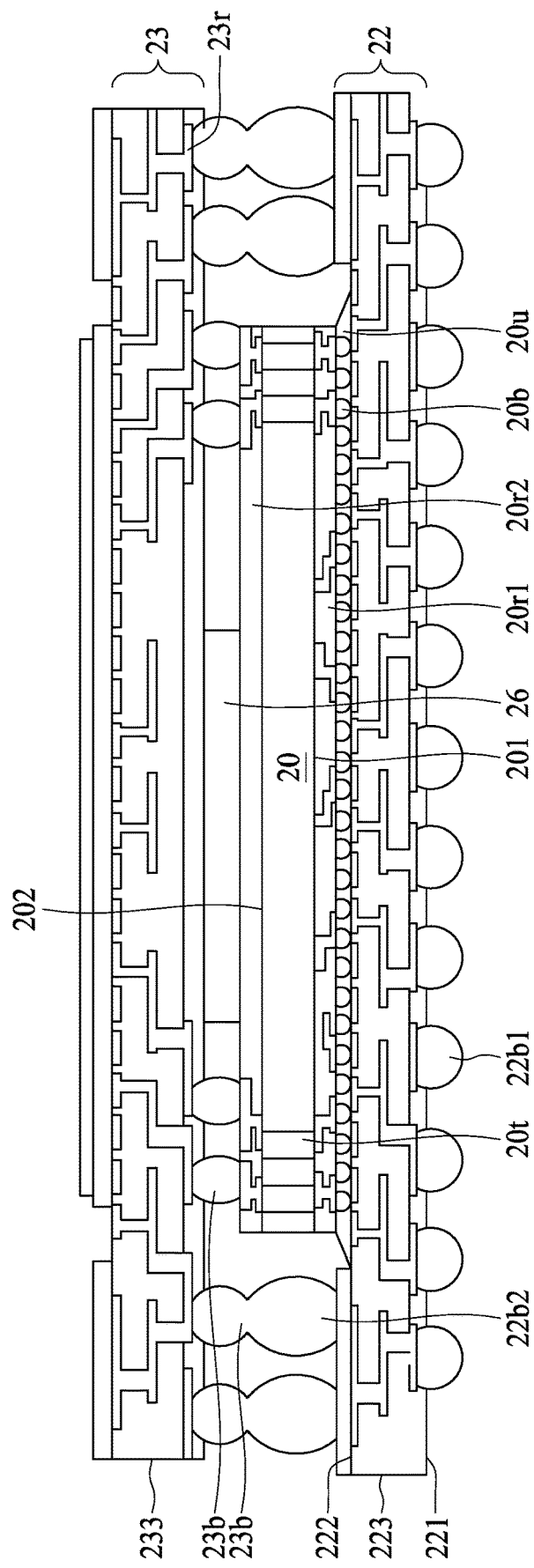
FIG. 5A illustrates one or more stages of a method of manufacturing a semiconductor device package in accordance with some embodiments of the present disclosure.

Referring to FIG. 5A, the operation in FIG. 5A may be subsequent to the operation in FIG. 4G, in which the buffer layer 26 is disposed on the interconnection structure 20r2. In FIG. 5A, the substrate 23 and the electrical contact 23b is provided on the substrate 22 and the electronic component 20.

Figure 5B:
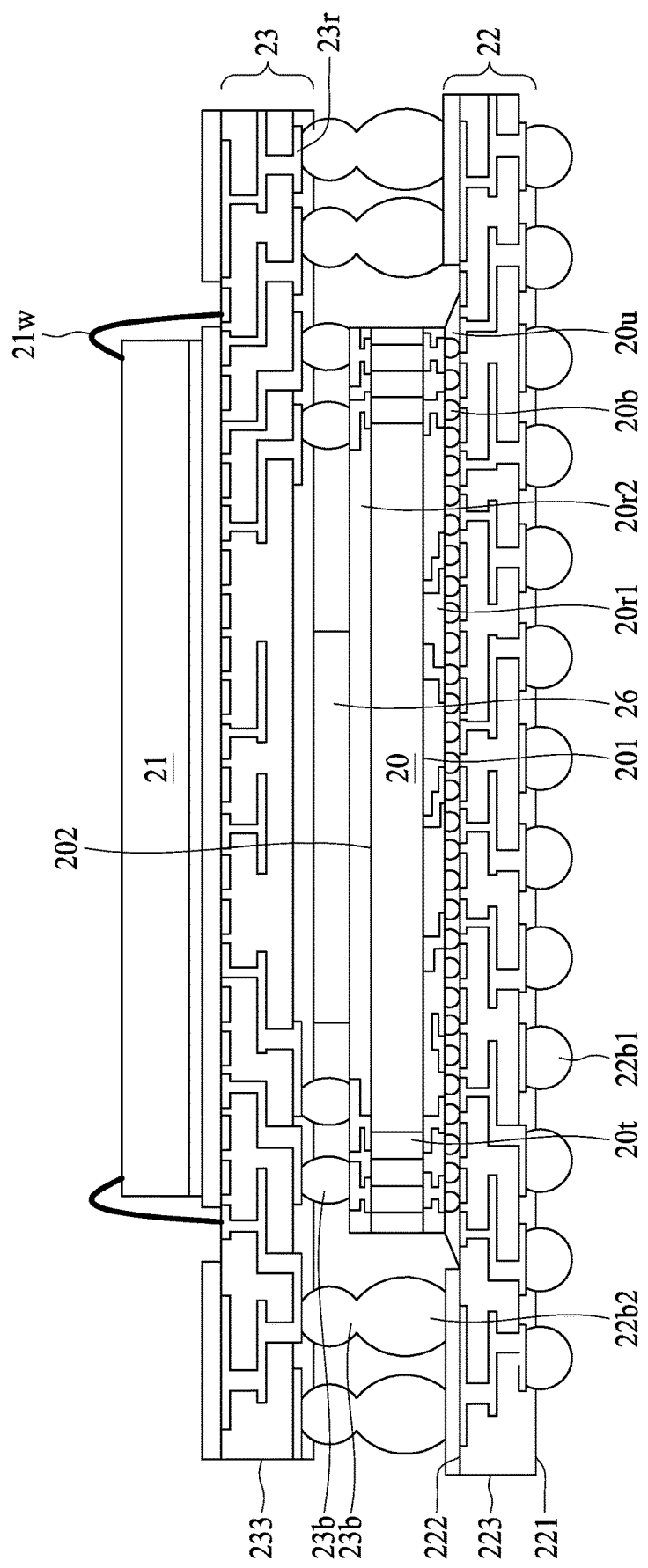
FIG. 5B illustrates one or more stages of a method of manufacturing a semiconductor device package in accordance with some embodiments of the present disclosure.

Referring to FIG. 5B, the electronic component 21 is provided on the substrate 22 through a flip-chip technique, a wire bonding technique (e.g., through a wire 21w), or other suitable technique.

Figure 5C:
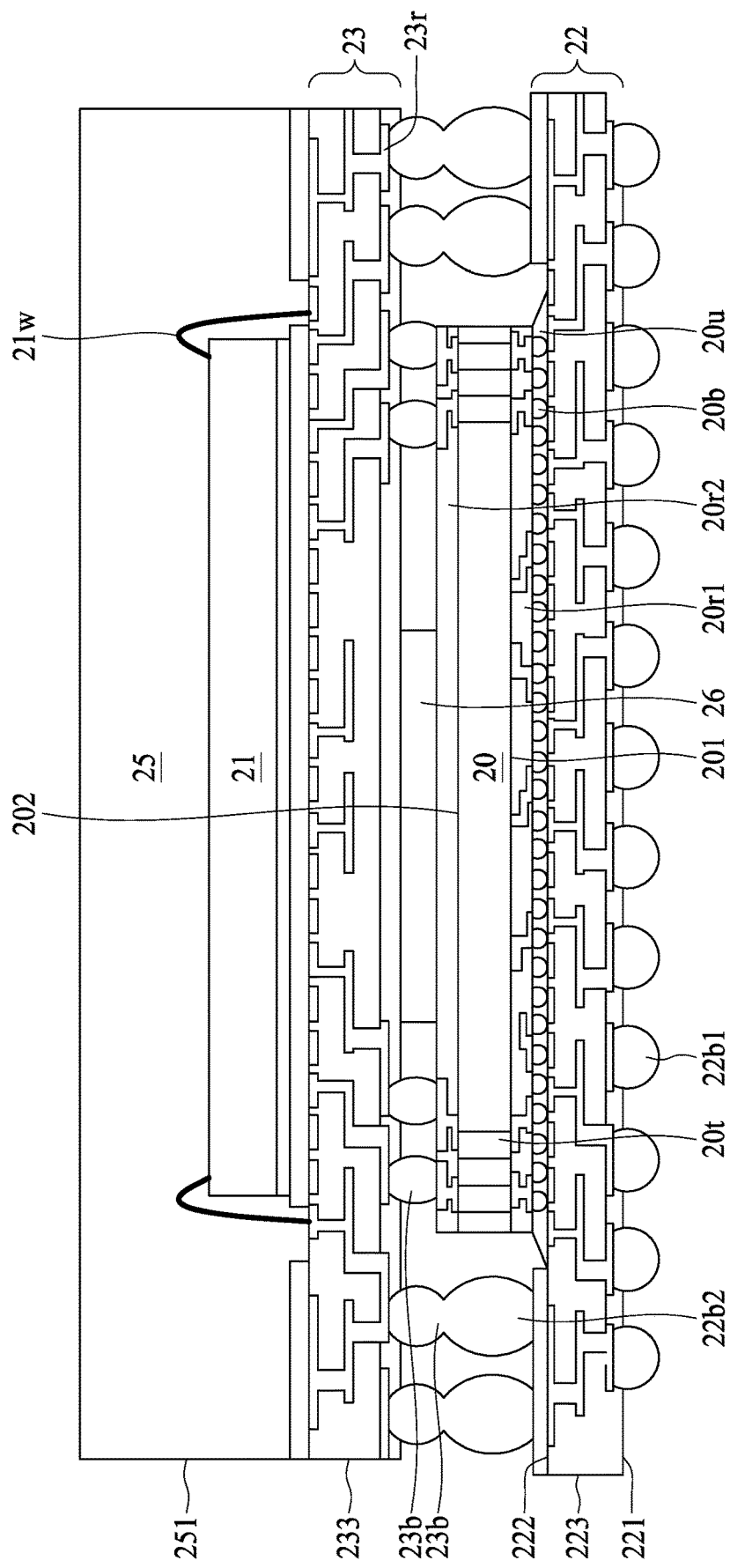
FIG. 5C illustrates one or more stages of a method of manufacturing a semiconductor device package in accordance with some embodiments of the present disclosure.

Referring to FIG. 5C, the encapsulating layer 25 is disposed on the substrate 23 to cover and encapsulate the electronic component 21. In some embodiments, the encapsulating layer 25 may be formed by a molding technique, such as transfer molding or compression molding.

Figure 5D:
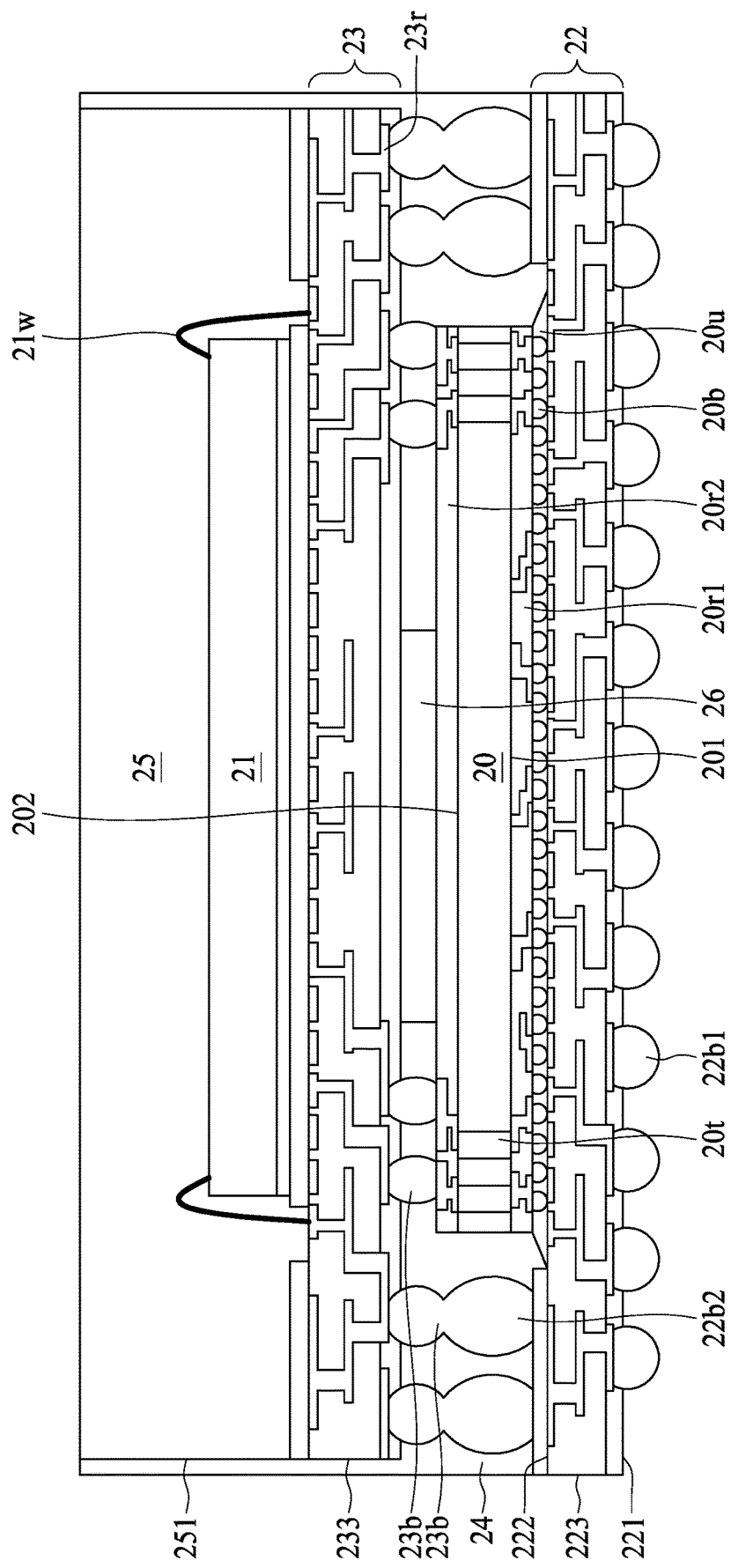
FIG. 5D illustrates one or more stages of a method of manufacturing a semiconductor device package in accordance with some embodiments of the present disclosure.

Referring to FIG. 5D, the encapsulating layer 24 is provided on the substrate 22 to cover and encapsulate the electronic component 20. The product obtained in the operation in FIG. 5D is the same as the product obtained in FIG. 4I. In some embodiments, the encapsulating layer 24 is formed before disposing the encapsulating layer 25, and the encapsulating layer 25 covers and surrounds the encapsulating layer 24 (such as shown in FIG. 3). In some embodiments, the formations for the encapsulating layer 24 and the encapsulating layer 25 may be conducted in the same operation. For examples, the encapsulating layer 24 and the encapsulating layer 25 may be formed at the same time.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in connection with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (µm) of lying along the same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
  a first redistribution layer (RDL);
  a first electronic component disposed over the first RDL, the first electronic component having a first surface facing the first RDL and a second surface opposite to the first surface;
  a second RDL adjacent to the first surface of the first electronic component; and
  a first electrical contact adjacent to the first electronic component, wherein a bottom surface of the first electrical contact aligns with a bottom surface of the second RDL,
  wherein a width of the first electrical contact is greater than a width of a conductive via passing through the first electronic component.

2. The semiconductor device package of claim 1, further comprising a first electrical connection element over the first electronic component.

3. The semiconductor device package of claim 2, further comprising a second electrical connection element at a side of the first RDL facing away from the second RDL.

4. The semiconductor device package of claim 1, further comprising
  a substrate disposed over the first electronic component; and
  a bonding structure between the substrate and the first electronic component.

5. The semiconductor device package of claim 1, further comprising:
  a third RDL adjacent to the second surface of the first electronic component; and
  an encapsulant layer encapsulating and contacting a lateral surface of the second RDL and a lateral surface of the third RDL.

6. A semiconductor device package, comprising:
  a first redistribution layer (RDL);
  a first electronic component disposed over the first RDL, the first electronic component having a first surface facing the first RDL and a second surface opposite to the first surface;
  a second RDL adjacent to the first surface of the first electronic component; and
  a first electrical contact adjacent to the first electronic component, wherein a bottom surface of the first electrical contact aligns with a bottom surface of the second RDL,
  wherein the first electronic component comprises a conductive via, and a surface of the conductive via substantially aligns with a surface of the first electronic component.

* * * * *